United States Patent
Moon et al.

(10) Patent No.: US 10,475,966 B2
(45) Date of Patent: Nov. 12, 2019

(54) LIGHTING EMITTING APPARATUS

(71) Applicant: LG INNOTEK CO., LTD., Seoul (KR)

(72) Inventors: Ji Wook Moon, Seoul (KR); Woo Seuk Song, Seoul (KR); Yong Jin Noh, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 106 days.

(21) Appl. No.: 15/742,476

(22) PCT Filed: Jul. 5, 2016

(86) PCT No.: PCT/KR2016/007215
§ 371 (c)(1),
(2) Date: Jan. 5, 2018

(87) PCT Pub. No.: WO2017/007209
PCT Pub. Date: Jan. 12, 2017

(65) Prior Publication Data
US 2018/0204983 A1  Jul. 19, 2018

(30) Foreign Application Priority Data
Jul. 8, 2015 (KR) .................. 10-2015-0097283

(51) Int. Cl.
*F21V 21/00* (2006.01)
*H01L 33/50* (2010.01)
*H01L 33/64* (2010.01)

(52) U.S. Cl.
CPC ............ *H01L 33/50* (2013.01); *H01L 33/502* (2013.01); *H01L 33/64* (2013.01); *H01L 33/504* (2013.01); *H01L 2933/0041* (2013.01)

(58) Field of Classification Search
CPC ....... H01L 33/50; H01L 33/502; H01L 33/64; H01L 33/504; H01L 2933/0041
(Continued)

(56) References Cited

U.S. PATENT DOCUMENTS

| 2009/0146549 A1 | 6/2009 | Kimura et al. |
| 2013/0234584 A1* | 9/2013 | Hattori ............... C09K 11/7734 313/503 |

(Continued)

FOREIGN PATENT DOCUMENTS

| JP | 4963705 | 6/2012 |
| JP | 2013-041876 | 2/2013 |

(Continued)

OTHER PUBLICATIONS

International Search Report (with English Translation) and Written Opinion dated Oct. 7, 2016 issued in Application No. PCT/KR2016/007215.

*Primary Examiner* — Laura K Tso
(74) *Attorney, Agent, or Firm* — Ked & Associates, LLP (57) ABSTRACT

Embodiments provide a light-emitting device comprising: a light-emitting element configured for emitting excited light; a first wavelength conversion material to partially absorbs the excited light and emits light with a first emission wavelength; a second wavelength conversion material to partially absorbs the excited light and emits light with a second emission wavelength; and a third wavelength conversion material to partially absorbs the excited light and emits light with a third emission wavelength, wherein the first emission wavelength has a first emission peak at 530 nm to 540 nm, the second emission wavelength has a second emission peak at 550 nm to 560 nm, the third light-emitting device has a third emission peak at 620 nm to 650 nm.

20 Claims, 9 Drawing Sheets

(58) Field of Classification Search
USPC .................................................. 362/84, 231
See application file for complete search history.

(56) References Cited

U.S. PATENT DOCUMENTS

| | | | | |
|---|---|---|---|---|
| 2017/0250324 A1* | 8/2017 | Seki | ...................... | H01L 33/504 |
| 2017/0345976 A1* | 11/2017 | Asai | ...................... | H01L 33/504 |
| 2018/0203301 A1* | 7/2018 | Hosokawa | ............ | H01L 33/502 |
| 2019/0013448 A1* | 1/2019 | Nakano | ................. | H01L 33/504 |
| 2019/0097098 A1* | 3/2019 | Fujio | ..................... | H01L 33/507 |
| 2019/0109266 A1* | 4/2019 | Hosokawa | ............ | H01L 33/504 |

FOREIGN PATENT DOCUMENTS

| | | |
|---|---|---|
| JP | 2015-046607 | 3/2015 |
| KR | 10-2013-0103360 | 9/2013 |
| KR | 10-1417874 | 7/2014 |

* cited by examiner

LIGHTING EMITTING APPARATUS

CROSS-REFERENCE TO RELATED PATENT APPLICATIONS

This application is a U.S. National Stage Application under 35 U.S.C. § 371 of PCT Application No. PCT/KR2016/007215, filed Jul. 5, 2016, which claims priority to Korean Patent Application No. 10-2015-0097283, filed Jul. 8, 2015, whose entire disclosures are hereby incorporated by reference.

BACKGROUND

Field of the Present Disclosure

An embodiment relates to a light-emitting device.

Discussion of Related Art

A light emitting device (LED) includes a compound semiconductor device that converts electrical energy into light energy. In the compound semiconductor device, various colors can be realized by controlling the composition ratio of the compound semiconductor.

The nitride semiconductor light emitting device has advantages of low power consumption, semi-permanent lifetime, fast response speed, safety, and environmental friendliness compared to conventional light sources such as fluorescent lamps and incandescent lamps. Accordingly, the nitride semiconductor light emitting device has been applied to a light emitting diode backlight replacing a cold cathode fluorescent lamp (CCFL) as a backlight of an LCD (Liquid Crystal Display) device, to a white light emitting diode lighting device replacing a fluorescent lamp or an incandescent lamp, and to automotive headlights, and traffic lights.

A light-emitting device may emit white light by combining a light emitting element (light emitting chip) and phosphor. In general, white light may be realized by using a blue light emitting element and yellow phosphor (YAG). However, this approach has a problem that the color rendering is relatively low.

Recently, a technique for realizing white light by mixing silicate phosphor and nitride phosphor has been developed. However, the silicate phosphor is vulnerable to moisture and heat, and, thus, the reliability of the light-emitting device is deteriorated.

SUMMARY

Embodiments provide a light-emitting device with excellent thermal properties.

The purposes to be solved by the embodiments are not limited thereto. The purposes to be solved by the embodiments may include objects and effects that may be apparent from technical solutions and embodiments described below.

In one aspect of the present disclosure, there is provided a light-emitting device comprising: a light-emitting element configured for emitting excited light; a first wavelength conversion material to partially absorbs the excited light and emits light with a first emission wavelength; a second wavelength conversion material to partially absorbs the excited light and emits light with a second emission wavelength; and a third wavelength conversion material to partially absorbs the excited light and emits light with a third emission wavelength, wherein the first emission wavelength has a first emission peak at 530 nm to 540 nm, the second emission wavelength has a second emission peak at 550 nm to 560 nm, the third light-emitting device has a third emission peak at 620 nm to 650 nm.

In one embodiment, all of the first to third wavelength conversion materials are nitride-based fluorescent materials.

In one embodiment, a full-width at half maximum (FWHM) of the first emission peak is greater than a full width at half maximum (FWHM) of the second emission peak.

In one embodiment, the full width at half maximum (FWHM) of the first emission peak is in a range of 105 nm to 115 nm, and the full width at half maximum (FWHM) of the second emission peak is in a range of 80 nm to 90 nm.

In one embodiment, the third emission peak has a full width at half maximum (FWHM) of 75 nm to 90 nm.

In one embodiment, the first emission wavelength has a sub-emission peak at 570 nm to 610 nm, and the second emission peak is positioned between the first emission peak and the sub-emission peak of the first emission wavelength.

In one embodiment, an intensity ratio between the first emission peak and the sub-emission peak of the first emission wavelength is in a range of 4:2.5 to 4:3.5.

In one embodiment, the first wavelength conversion material has a following chemical formula 1:

$$La_xSi_yN_z:Ce^{3+} \qquad \text{[Chemical formula 1]}$$

where x is from 2.5 to 3.5, y is from 5 to 7, and z is from 9 to 13.

In one embodiment, the second wavelength conversion material has a following chemical formula 2:

$$(Sr_a,Ba_b)_3Si_cO_dN_e:Eu^{2+} \qquad \text{[Chemical formula 2]}$$

where each of a and b is from 1 to 4, c is from 1 to 8, and d is from 1 to 8, and e is from 1 to 8.

In one embodiment, the third wavelength conversion material has a following chemical formula 3:

$$(Sr_a,Ca_b)Al_cSi_dN_e:Eu^{2+} \qquad \text{[Chemical formula 3]}$$

where each of a and b is from 0.5 to 3, c is from 0.5 to 3, d is from 0.5 to 3, and e is from 1 to 5.

In one embodiment, the device comprises a wavelength conversion layer comprising a light-transmissive resin and the first to third wavelength conversion materials dispersed in the light-transmissive resin.

In one embodiment, when a sum of contents of the first to third wavelength conversion materials is defined as 100 wt %, the first wavelength conversion material has a content of 30 wt % to 80 wt %, the second wavelength conversion material has a content of 10 wt % to 65.5 wt %, and the third wavelength conversion material has a content of 0.5 wt % to 10%.

In one embodiment, the device comprises a body having a cavity defined therein for accommodating the light-emitting element and the wavelength conversion layer therein.

In one embodiment, a total content of the first to third wavelength conversion materials is in a range of 5 wt % to 40 wt % of an entire content of the wavelength conversion layer.

According to the embodiments, the luminance uniformity and thermal properties of the light-emitting device may be improved.

The various advantageous effects and advantages of the present invention are not limited to the above descriptions and may be more easily understood in the process of describing the specific embodiments of the present invention.

DETAILED DESCRIPTIONS

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof.

In the description of the embodiments, when a first element is described as being formed "on or under" a second element, this means that the first and second elements are in direct contact with each other or one or more other elements are indirectly formed between the first and second elements. Further, the configuration that a first element is described as being formed "on or under" a second element may be exchangeable with the configuration that a second element is described as being formed "on or under" a first element.

Hereinafter, embodiments will be described in detail with reference to the accompanying drawings, wherein like or corresponding elements are denoted by like reference numerals, and redundant descriptions thereof will be omitted.

Figure 1:
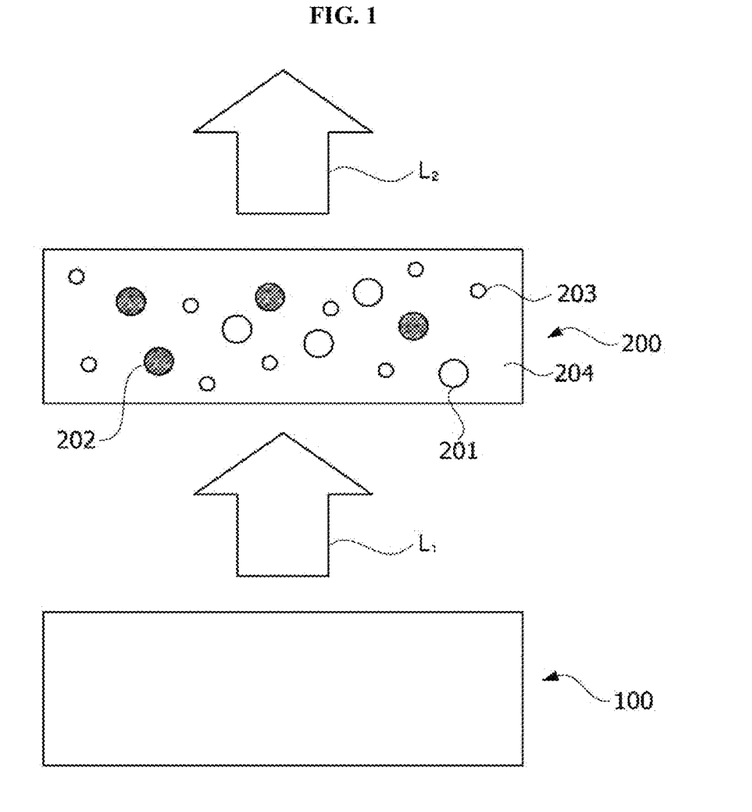
FIG. 1 is a conceptual diagram of a light-emitting device according to one embodiment of the present invention.
Figure 2:
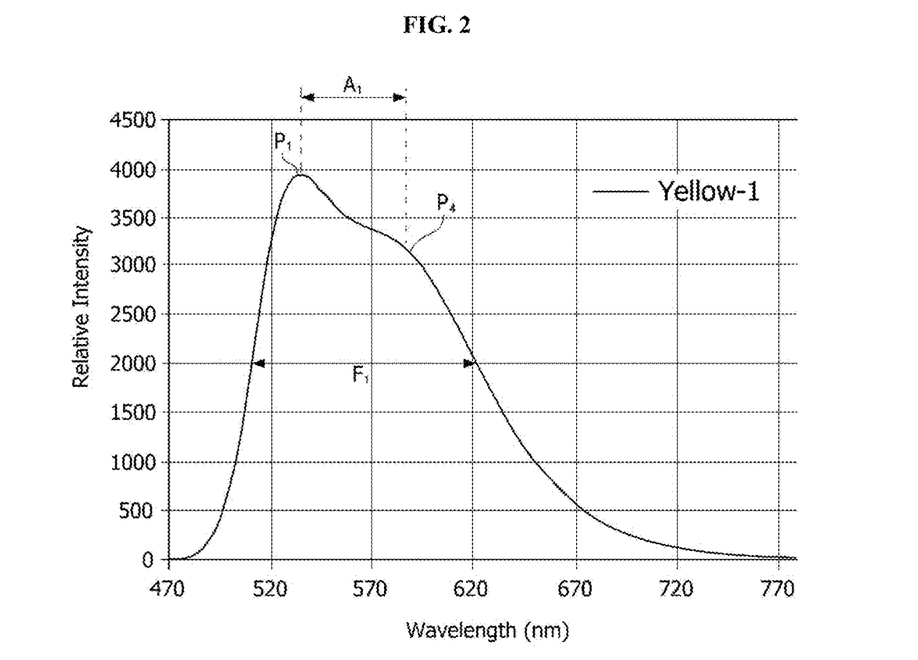
FIG. 2 shows a light-emitting spectrum of the first wavelength conversion material of FIG. 1.
Figure 3:
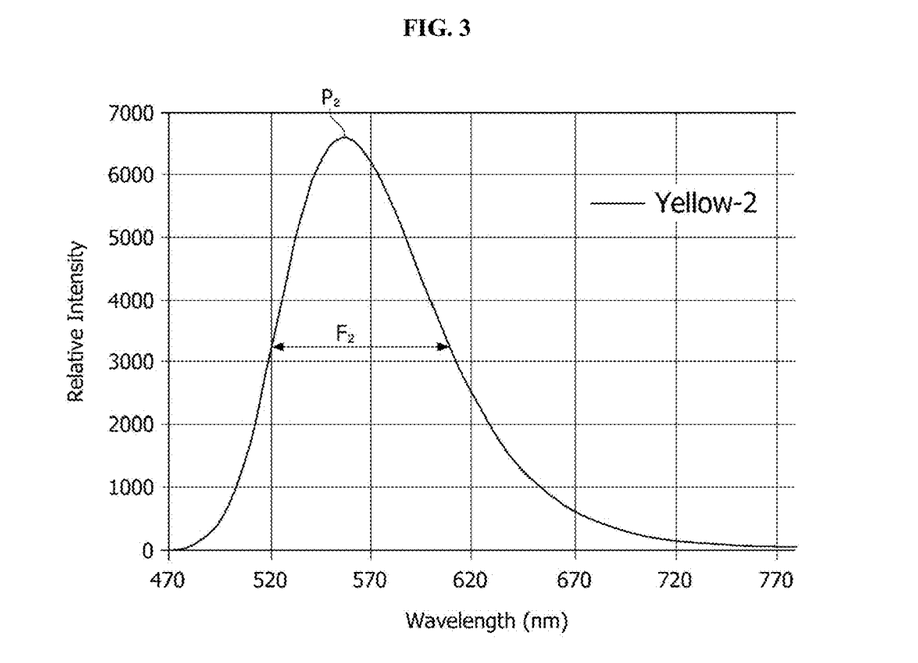
FIG. 3 shows a light-emitting spectrum of the second wavelength conversion material of FIG. 1.
Figure 4:
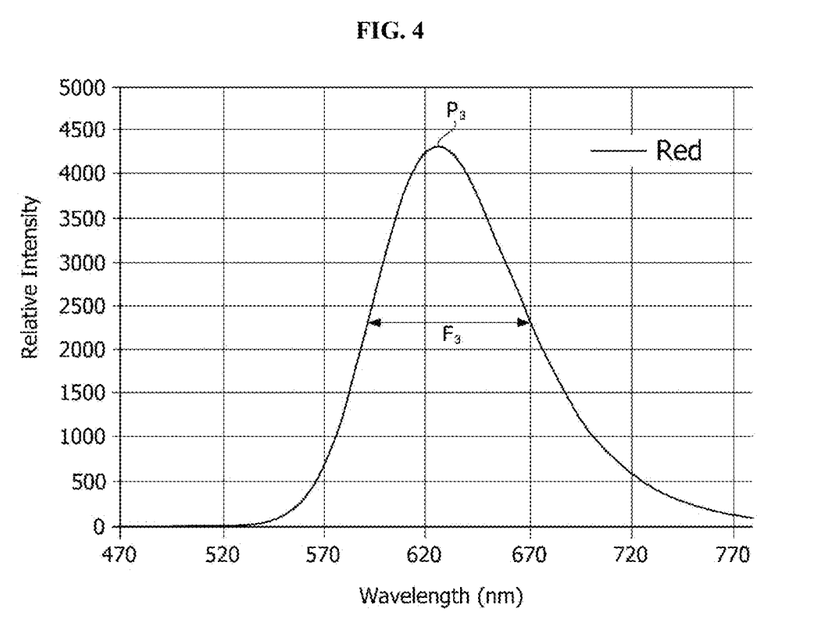
FIG. 4 shows a light-emitting spectrum of the third wavelength conversion material of FIG. 1.

FIG. 1 is a conceptual diagram of a light-emitting device according to one embodiment of the present invention. FIG. 2 shows a light-emitting spectrum of the first wavelength conversion material of FIG. 1. FIG. 3 shows a light-emitting spectrum of the second wavelength conversion material of FIG. 1. FIG. 4 shows a light-emitting spectrum of the third wavelength conversion material of FIG. 1.

Referring to FIG. 1, a light-emitting device according to an embodiment includes a light-emitting element 100 that emits excited light L1 and a wavelength conversion layer 200 that absorbs a portion of the excited light L1 and then emits light.

The light-emitting element 100 may be embodied as a blue light-emitting element emitting an excited light of 420 nm to 470 nm, or as a UV light-emitting element emitting an excited light of ultraviolet wavelength band. The electrode structure of the light-emitting element 100 is not particularly limited.

The wavelength conversion layer 200 includes first to third wavelength conversion materials 201, 202 and 203. The first to third wavelength conversion materials 201, 202, and 203 may be dispersed in the light-transmissive resin 204 in contents of 5 wt % to 40 wt %. When the first to third wavelength conversion materials 201, 202, and 203 are dispersed in the range of 5 wt % to 40 wt %, the first to third wavelength conversion materials 201, 202, and 203 may be uniformly dispersed in the light-transmissive resin 204 while implementing white light on the CIE color coordinate. The first to third wavelength conversion materials 201, 202 and 203 may be nitride fluorescent materials.

When the sum of the contents of the first to third wavelength conversion materials is defined as 100 wt %, the first wavelength conversion material 201 may have an amount of 30 wt % to 80 wt %, the second wavelength conversion material 202 may have an amount of 10 wt % to 65.5 wt %, and the third wavelength conversion material 203 may have a content of 0.5 wt % to 10%.

The structure of the wavelength conversion layer 200 is not limited particularly. The wavelength conversion layer 200 may be disposed only on the top face of the light-emitting element 100, or may be disposed on the top face and the side faces thereof. The wavelength conversion layer 200 may be filled in the cavity of the package to mold an entirety of the light-emitting element 100. The light-transmissive resin 204 may be made of at least one resin selected from the group consisting of epoxy resin, silicone resin, polyimide resin, urea resin, and acrylic resin.

The excited light L1 emitted from the light-emitting element 100 and the light converted by the wavelength conversion layer 200 may be mixed to realize white light L2 on the CIE color coordinate.

Referring to FIG. 2, the first wavelength conversion material may partially absorb the excited light to emit light beams with a first emission wavelength (yellow 1). The first wavelength conversion material may satisfy a structural formula of $La_xSi_yN_z:Ce^{3+}$. In this connection, x may be from 2.5 to 3.5, y may be from 5 to 7, and z may be from 9 to 13. Ce may be from 0.01 to 0.3. The first wavelength conversion material 201 may be a nitride fluorescent material represented by $La_3Si_6N_{11}:Ce^{3+}$.

The first emission wavelength may have a first emission peak P1 at 530 nm to 540 nm. Further, the first emission wavelength may further have a sub-emission peak P4 at 570 nm to 610 nm. Since the active element Ce may have various ground states, the first wavelength conversion material 201 may have a plurality of sub-peaks due to the energy level difference between the ground states. FIG. 2 shows a spectrum having a single sub-emission peak, but a plurality of sub-emission peaks may be available.

In the first range A1 between the first emission peak P1 and the sub-emission peak P4, the decreasing slope of the light-emitting intensity may be relatively moderate. The intensity ratio of the first emission peak P1 and sub-emission peak P4 may be from 4:2.5 to 4:3.5. When the intensity ratio of this range is satisfied, the light from the first wavelength conversion material 201 may be mixed with the light from the second wavelength conversion material 202 so as to secure sufficient intensity in the first range A1.

The full width at half maximum (FWHM) F1 of the first emission peak P1 may be between 105 nm and 115 nm. In this connection, the full width at half maximum (FWHM) may refer to the width at the half intensity point of the first emission peak P1.

Referring to FIG. 3, the second wavelength conversion material may partially light the excited light to emit light beams with the second emission wavelength (yellow 2). The second emission wavelength has a second emission peak P2 at 550 nm to 560 nm.

The second emission peak P2 may be placed between the first emission peak and the sub-emission peak of the first wavelength conversion material. Further, the full width at half maximum (FWHM) F2 of the second emission peak P2 may be smaller than the full width at half maximum (FWHM) of the first emission peak P1. The full width at half maximum (FWHM) F2 of the second emission peak P2 may be 80 nm to 90 nm.

That is, the second wavelength conversion material may serve to reinforce the light-emitting intensity of the first wavelength conversion material in the first range A1 thereof. Therefore, the light-emitting intensity in the range of 550 nm to 560 nm may be improved by the second wavelength conversion material.

The second wavelength conversion material may satisfy any one of chemical formulas $M^{II}_3Si_6O_3N_8:Eu^{2+}$, $M^{II}_1Si_2O_2N_2:Eu^{2+}$, and $M^{II}_3Si_6O_3N_8F:Eu^{2+}$. $M^{II}$ may be at least one among Sr, Ba, Ca, and Mg. The second wavelength conversion material may be expressed as $(Sr_a,Ba_b)_3Si_cO_dN_e:Eu^{2+}$. In this connection, each of a and b may be from 1 to 4, c may be from 1 to 8, d may be from 1 to 8, and e may be from 1 to 8. Eu may be 0.01 to 0.3. For example, the second wavelength conversion material may be represented by $(Sr, Ba, Mg)_3Si_6O_3N_8F:Eu^{2+}$.

Referring to FIG. 4, the third wavelength conversion material may absorb some of the excited light and emit light with a third emission wavelength (red). The third emission wavelength may have a third emission peak P3 at 620 nm to 650 nm, and the full width at half maximum (FWHM) F3 thereof may be between 75 nm and 90 nm.

The third wavelength conversion material may be represented by $M^{II}AlSiN_3:Eu^{2+}$. In this connection, $M^{II}$ may be Sr, Ba, Ca, and Mg. For example, the third wavelength conversion material may be represented by $(Sr_a,Ca_b)Al_cSi_dN_e:Eu^{2+}$ where each of a and b may be from 0.5 to 3, c may be from 0.5 to 3, d may be from 0.5 to 3, e may be from 1 to 5. Eu may be 0.01 to 0.03.

Figure 5:
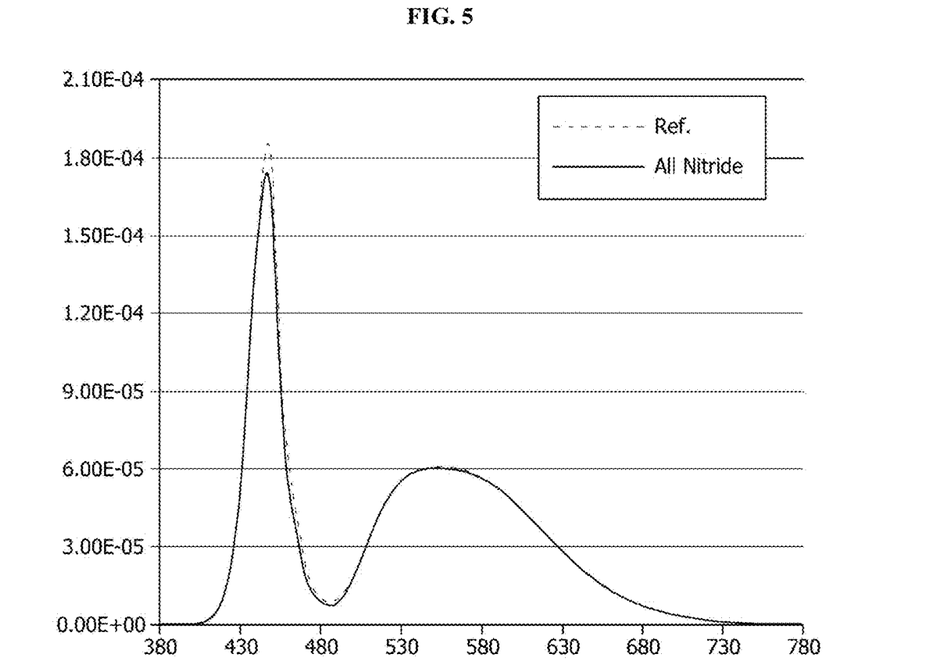
FIG. 5 shows a light-emitting spectrum of the white light implemented by the light-emitting device of FIG. 1 and a light-emitting spectrum of the white light implemented by the conventional fluorescent material.
Figure 6:
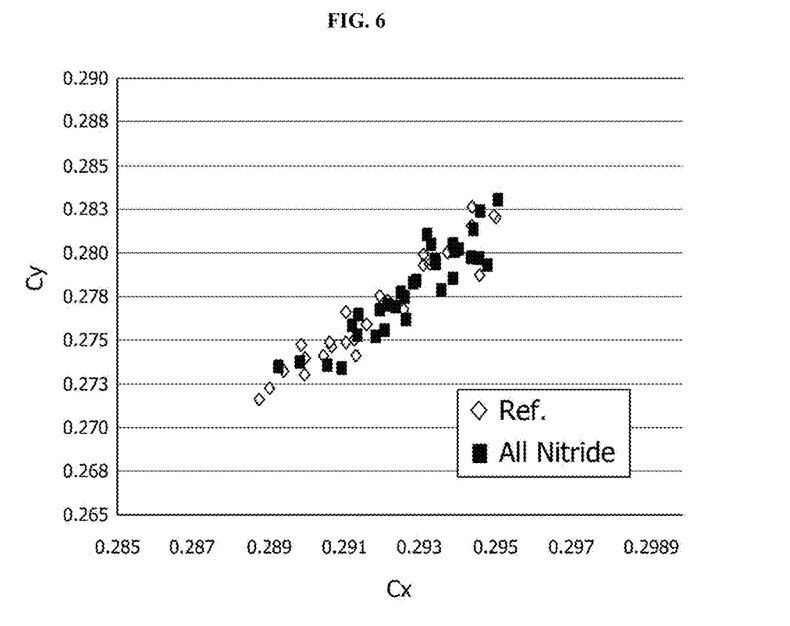
FIG. 6 shows CIE color coordinate of the white light implemented by the light-emitting device of FIG. 1 and CIE color coordinate of the white light implemented by the conventional fluorescent material.

FIG. 5 shows a light-emitting spectrum of white light implemented by the light-emitting device of FIG. 1, and a light-emitting spectrum of white light implemented by a conventional fluorescent material. FIG. 6 shows CIE color coordinate of the white light implemented by the light-emitting device of FIG. 1, and CIE color coordinate of the white light implemented by the conventional fluorescent material.

Referring to FIG. 5, the light-emitting spectrum of mixed light converted by the nitride-based first to third wavelength conversion materials (All nitride) may have a emission wavelength of about 480 nm to 730 nm. The mixed light may have a emission peak at about 530 nm to 580 nm, and the full width at half maximum (FWHM) of the emission peak may be at least 110 nm.

Therefore, using the nitride-based first to third wavelength conversion materials, it is possible to produce white light with excellent color rendering properties. An embodiment may enhance the light-emitting intensity in the first range of the first emission wavelength using the second wavelength conversion material, thereby to obtain the light-emitting spectrum with excellent color rendering properties.

The light-emitting spectrum according to the embodiment may be similar to the light-emitting spectrum of white light obtained using the conventional fluorescent material (Ref.). In this connection, the conventional fluorescent material (Ref.) may be configured as follows: a combination of the first wavelength conversion material and the third wavelength conversion material and a silicate fluorescent material instead of the second wavelength conversion material.

The silicate fluorescent material has a wavelength range similar to the second emission wavelength and may have a emission peak at 550 nm to 560 nm. The silicate fluorescent material may be represented by $M^{II}_2SiO_4:Eu^{2+}$ where $M_{II}$ may be represented by at least one of Sr, Ba, and Ca. However, this is exemplary. The conventional fluorescent material may include all of the configurations in which at least one of the first to third fluorescent materials to be combined with each other is a silicate fluorescent material.

Referring to FIG. 6, it may be seen that both of the CIE color coordinate of the mixed light implemented by the embodiment and the CIE color coordinate of the white light implemented by the conventional fluorescent material correspond to the white light region.

Figure 7:
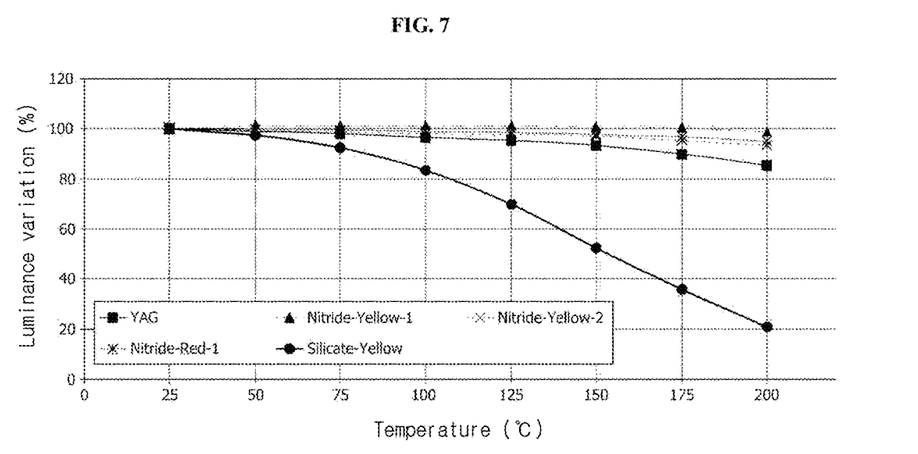
FIG. 7 is a graph showing changes in luminance of a YAG fluorescent material, a nitride fluorescent material, and a silicate fluorescent material according to a temperature change.
Figure 8:
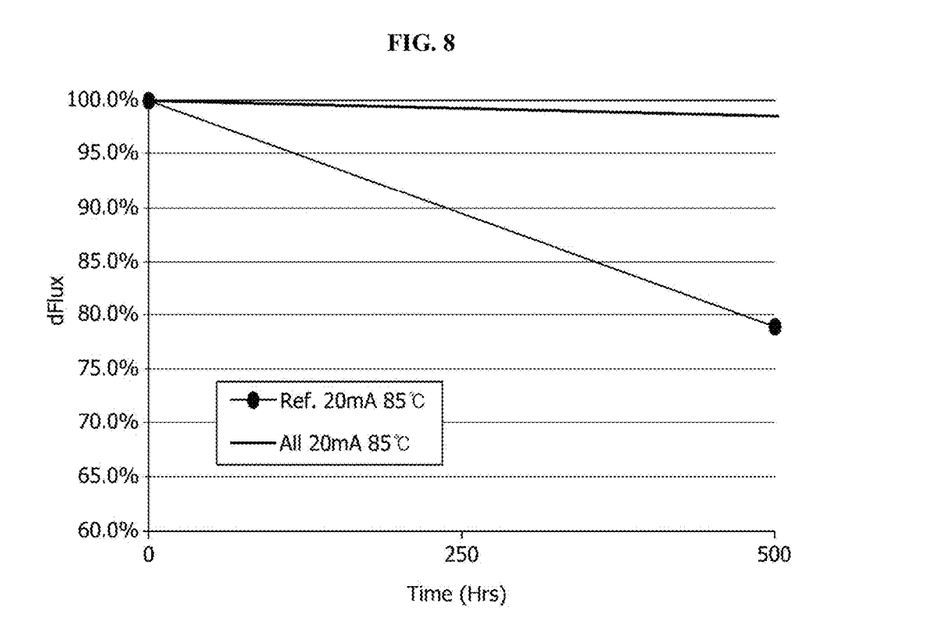
FIG. 8 is a graph showing changes in luminous flux over time for the wavelength conversion material of FIG. 1, and conventional fluorescent material under high temperature conditions.
Figure 9:
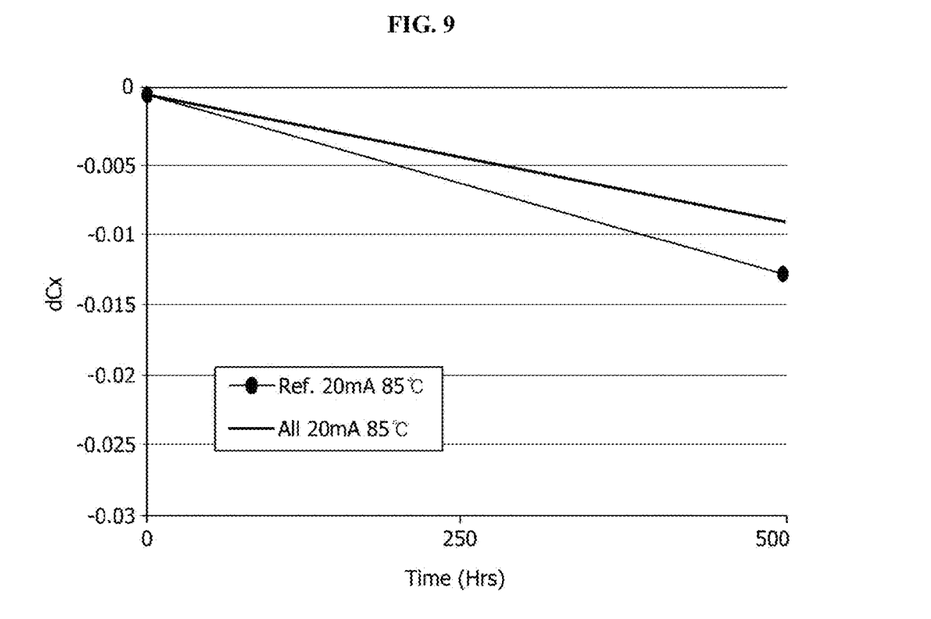
FIG. 9 is a graph showing changes in Cx coordinate over time for the wavelength conversion material of FIG. 1 and conventional fluorescent material under high temperature conditions.
Figure 10:
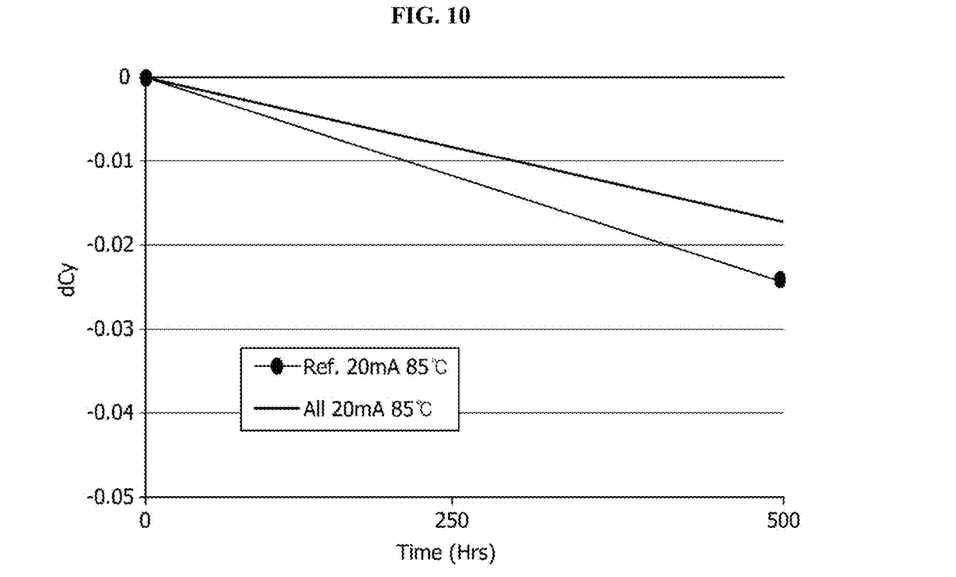
FIG. 10 is a graph showing changes in Cy coordinate over time for the wavelength conversion material of FIG. 1, and the conventional fluorescent material under a high temperature condition.

FIG. 7 is a graph showing changes in luminance of a YAG fluorescent material, a nitride fluorescent material, and a silicate fluorescent material according to a temperature change. FIG. 8 is a graph showing changes in luminous flux over time for the wavelength conversion material of FIG. 1, and conventional fluorescent material under high temperature conditions. FIG. 9 is a graph showing changes in Cx coordinate over time for the wavelength conversion material of FIG. 1 and conventional fluorescent material under high temperature conditions. FIG. 10 is a graph showing changes in Cy coordinate over time for the wavelength conversion material of FIG. 1, and the conventional fluorescent material under a high temperature condition.

Referring to FIG. 7, it may be seen that as the temperature increases, the luminance of the lights emitted by the YAG fluorescent material and silicate fluorescent material decreases. In particular, the luminance of light emitted by the silicate fluorescent material sharply decreases when the temperature exceeds 100° C., and the luminance change rate is 20% when the temperature is 200° C. In contrast to this, the luminance of light emitted by the first to third wavelength conversion materials, which are nitride fluorescent materials, shows little change even at a temperature of 200 C. Therefore, when the first to third wavelength conversion materials, which are nitride fluorescent materials, are used, the light-emitting device having excellent thermal characteristics may be obtained.

Referring to FIG. 8, the luminous flux of the light emitted by the conventional fluorescent material decreases rapidly over time. This is probably due to the deterioration of the silicate fluorescent material. Referring to FIG. 9 and FIG. 10, it may be seen that as time passes, the Cx and Cy color coordinates of the light emitted by the conventional fluorescent material change more rapidly than the Cx and Cy color coordinates of the light emitted by the embodiment (All).

Figure 11:
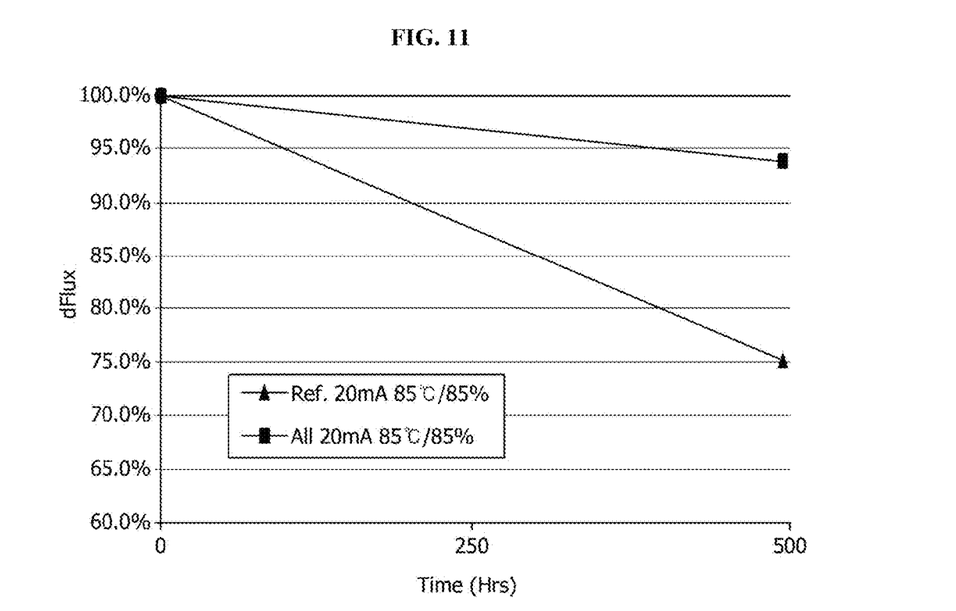
FIG. 11 is a graph showing changes in luminous flux over time for the wavelength conversion material of FIG. 1, and the conventional fluorescent material under high temperature/high humidity conditions.
Figure 12:
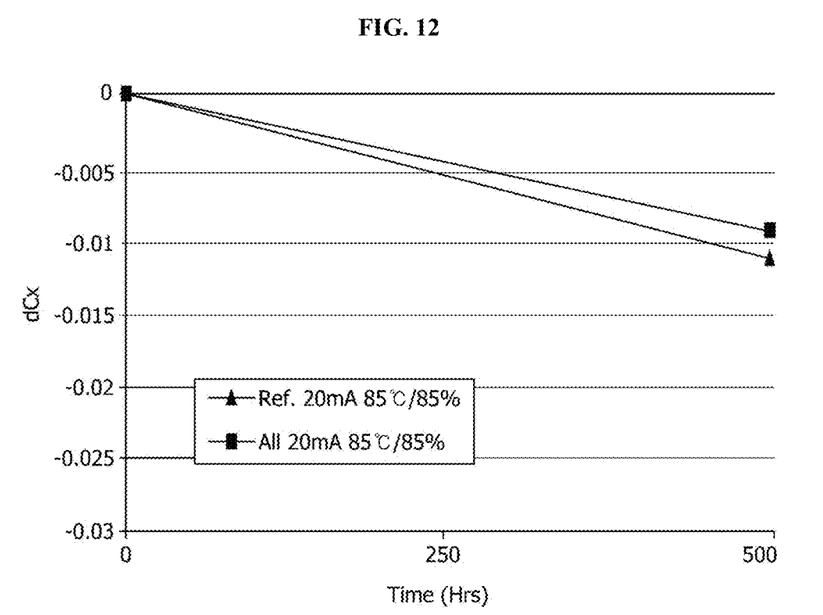
FIG. 12 is a graph showing changes in Cx coordinate over time for the wavelength conversion material of FIG. 1, and the conventional fluorescent material under high temperature/high humidity conditions.
Figure 13:
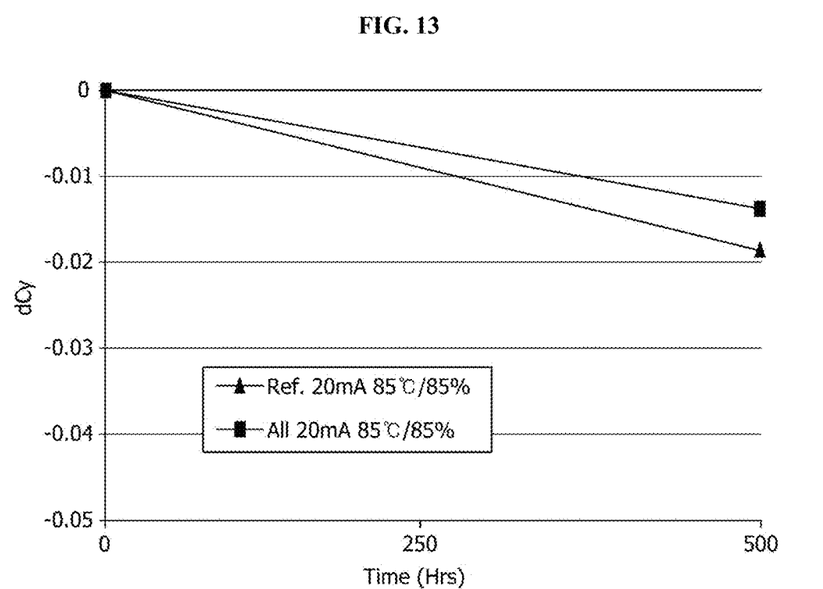
FIG. 13 is a graph showing changes in Cy coordinate over time for the wavelength conversion material of FIG. 1, and the conventional fluorescent material under high temperature/high humidity conditions.

FIG. 11 is a graph showing changes in luminous flux over time for the wavelength conversion material of FIG. 1, and the conventional fluorescent material under high temperature/high humidity conditions. FIG. 12 is a graph showing changes in Cx coordinate over time for the wavelength conversion material of FIG. 1, and the conventional fluorescent material under high temperature/high humidity conditions. FIG. 13 is a graph showing changes in Cy coordinate over time for the wavelength conversion material of FIG. 1, and the conventional fluorescent material under high temperature/high humidity conditions. Further, referring to FIG. 11 to FIG. 13, it may be seen that the luminous flux and color coordinate of the light emitted by the conventional fluorescent material change sharply at the high temperature of 85° C. and the high humidity of 85% compared with the luminous flux and color coordinates of the light emitted by the present embodiment.

Considering the above comparisons, a configuration that the first to third wavelength conversion materials all are nitride-based has superior luminance, luminous flux, color coordinate characteristics than the configuration that at least one of the first to third wavelength conversion materials is a silicate fluorescent material.

Figure 14:
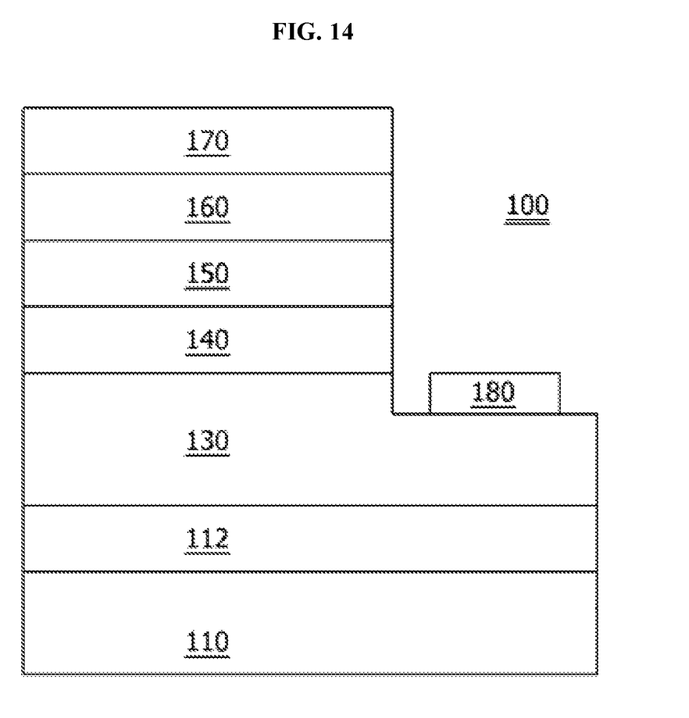
FIG. 14 is a conceptual diagram of a light-emitting device of FIG. 1.
Figure 15:
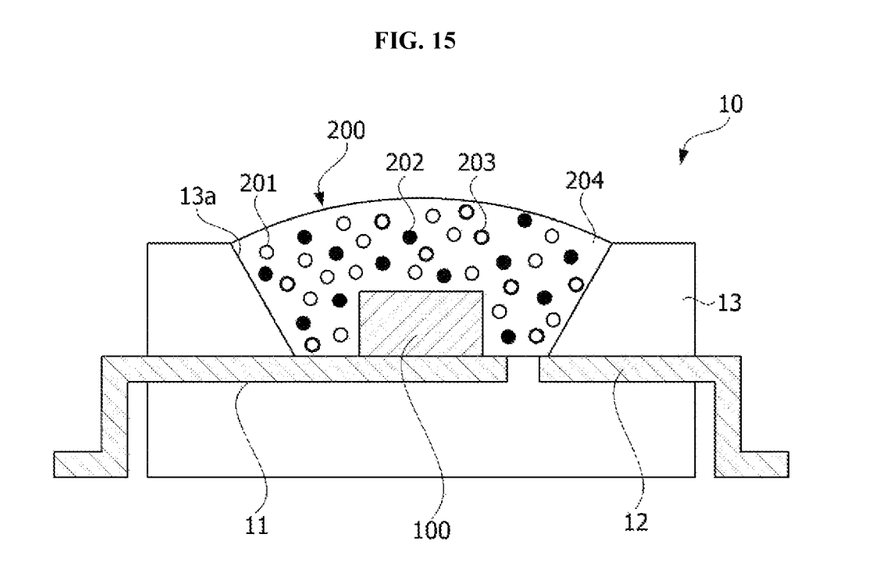
FIG. 15 is a conceptual diagram of a light-emitting device package according to one embodiment of the present invention.

FIG. 14 is a conceptual diagram of a light-emitting device of FIG. 1. FIG. 15 is a conceptual diagram of a light-emitting device package according to one embodiment of the present invention.

Referring to FIG. 14, a substrate 110 of the light-emitting element 100 includes a conductive substrate or an insulating substrate. The substrate 110 may be a material or carrier wafer suitable for semiconductor material growth. The substrate 110 may be made of a material selected from sapphire $Al_2O_3$, SiC, GaAs, GaN, ZnO, Si, GaP, InP, and Ge. However, the substrate 110 is not limited thereto.

The buffer layer 112 may mitigate the lattice mismatch between the light-emitting structure on the substrate 110 and the substrate 110. The buffer layer 112 may be grown as a single crystal layer on the substrate 110, and the buffer layer 112 grown as the single crystal layer can improve the crystallinity of the first semiconductor layer 130.

The light-emitting structure provided on the substrate 110 includes a first semiconductor layer 130, an active layer 140, and a second semiconductor layer 160. Generally, the light-emitting structure as described above may be divided into a plurality of sub-light-emitting structure by cutting the substrate 110.

The first semiconductor layer 130 may be a compound semiconductor such as groups III-V or groups II-VI, and the first semiconductor layer 130 may be doped with a first dopant. The first semiconductor layer 130 may be selected from semiconductor materials having a composition formula of $In_{x1}Al_{y1}Ga_{1-x1-y1}N$ ($0 \leq x1 \leq 1$, $0 \leq y1 \leq 1$, $0 \leq x1+y1 \leq 1$), for example, from GaN, AlGaN, InGaN, InAlGaN. The first dopant may be an n-type dopant such as Si, Ge, Sn, Se, or Te. When the first dopant is the n-type dopant, the first semiconductor layer 130 doped with the first dopant may be an n-type semiconductor layer.

In the active layer 140, electrons (or holes) injected through the first semiconductor layer 130 and holes (or electrons) injected through the second semiconductor layer 160 are combined with each other. As the electrons and the holes are recombined therein, the active layer 140 may transition to a low energy level and thus generate light having a wavelength corresponding thereto. There is no limit to the emission wavelength in this embodiment.

The active layer 140 may have any one of a single well structure, a multi-well structure, a single quantum well structure, a multi quantum well (MQW) structure, a quantum dot structure or a quantum wire structure. The structure of the active layer 140 is not limited thereto.

The active layer 140 may have a structure in which a plurality of well layers and barrier layers are alternately arranged with each other. Each of the well layer and the barrier layer may have a composition formula of $In_xAl_yGa_{1-x-y}N$ ($0 \leq x \leq 1$, $0 \leq y \leq 1$, $0 \leq x+y \leq 1$). The energy band gap of the barrier layer may be higher than an energy band gap of the well layer.

The second semiconductor layer 160 is formed on the active layer 140. The layer 160 may be made of a compound semiconductor such as groups III-V or groups II-VI. The second semiconductor layer 160 may be doped with a second dopant. The second semiconductor layer 160 may be made of a semiconductor material having a composition formula of $In_{x5}Al_{y2}Ga_{1-x5-y2}N$ ($0 \leq x5 \leq 1$, $0 \leq y2 \leq 1$, $0 \leq x5+y2 \leq 1$), for example, of a material selected from AlInN, AlGaAs, GaP, GaAs, GaAsP, AlGaInP. The second dopant is a p-type dopant such as Mg, Zn, Ca, Sr, and Ba. The second semiconductor layer 160 doped with the second dopant may be a p-type semiconductor layer.

An electron-blocking layer EBL 150 may be disposed between the active layer 140 and the second semiconductor layer 160. The electron blocking layer 150 may block the flow of electrons supplied from the first semiconductor layer 130 to the second semiconductor layer 160, thereby to increase the recombination probability between electrons and holes in the active layer 140. The energy band gap of the electron blocking layer 150 may be greater than the energy band gap of the active layer 140 and/or the second semiconductor layer 160.

The electron blocking layer 150 may be made of a semiconductor material having a composition formula of $In_{x1}Al_{y1}Ga_{1-x1-y1}N$ (0≤x1≤1, 0≤y1≤1, 0≤x1+y1≤1), for example, AlGaN, InGaN, InAlGaN. However, the present invention is not limited thereto.

The first electrode 180 may be formed on the first semiconductor layer 130 as partially exposed. Further, on the second semiconductor layer 160, a second electrode 170 may be formed. Each of the first electrode 180 and the second electrode 190 may be made of various metals and transparent electrode materials. Each of the first electrode 180 and the second electrode 170 may be made of a metal such as In, Co, Si, Ge, Au, Pd, Pt, Ru, Re, Mg, Zn, Hf, Ta, Rh, Ir, W, Ti, Ag, Cr, Mo, Nb, Al, Ni, Cu, and WTi. If desired, each of the first electrode 180 and the second electrode 190 may further comprise an ohmic electrode layer.

Referring to FIG. 15, a light-emitting element package 10 according to an embodiment includes a first lead frame 11, a second lead frame 12, a light-emitting element 100, a wavelength conversion layer 200, and a body 13.

The light-emitting element 100 may include a light-emitting element having various structures that emit light in the blue or ultraviolet wavelength range. Further, the light-emitting element 100 may include one as shown in FIG. 14. The light-emitting element 100 is electrically connected to the first lead frame 11 and the second lead frame 12. The electrical connection between the light-emitting element 100 and the first and second lead frames 11 and 12 may be modified according to the electrode structure of the light-emitting element (vertical or horizontal structure).

The body 13 fixes the first lead frame 11 and the second lead frame 12. The body 13 defines a cavity 13a through which the light-emitting element 100 is exposed. The body 13 may include a polymeric resin such as PPA (polyphthalamide).

The wavelength conversion layer 200 is disposed in the cavity 13a and includes the first to third wavelength conversion materials 201, 202, and 203. The first to third wavelength conversion materials 201, 202, and 203 may be dispersed in the light-transmissive resin 204 at a content of 5 wt % to 40 wt %. The first to third wavelength conversion materials 201, 202, and 203 may include the above-described characteristics.

A light-emitting device or a light-emitting device package according to an embodiment further includes optical members such as a light guide plate, a prism sheet, and a diffusion sheet, thereby functioning as a backlight unit. Further, a light-emitting device according to an embodiment may be applied to a display device, a lighting device, and a pointing device.

In this connection, the display device may include a bottom cover, a reflector, a light-emitting module, a light guide plate, an optical sheet, a display panel, an image signal output circuit and a color filter. The bottom cover, reflector, light-emitting module, light guide plate and optical sheet may constitute a backlight unit.

The reflector is disposed on the bottom cover, and the light-emitting module emits light. The light guide plate is disposed in front of the reflector to guide the light emitted from the light-emitting module forward. The optical sheet includes a prism sheet or the like and is disposed in front of the light guide plate. The display panel is disposed in front of the optical sheet. The image signal output circuit supplies an image signal to the display panel, and the color filter is disposed in front of the display panel.

The lighting device may include a light source module including a substrate and a light-emitting element according an embodiment, a heat dissipation unit for dissipating heat of the light source module, and a power supply unit for processing or converting an electric signal provided from the outside and for supplying the signal to the light source module. Further, the lighting device may include a lamp, a head lamp, or a street lamp or the like.

It will be apparent to those skilled in the art that embodiments of the present invention as described above is not limited to the above-described embodiments and the accompanying drawings, but various modifications and variations may be made thereto without departing from the spirit or scope of the inventive concept as defined by the appended claims.

What is claimed is:

1. A light-emitting device comprising:
   a light-emitting element configured for emitting excited light;
   a first wavelength conversion material to partially absorbs the excited light and emits light with a first emission wavelength;
   a second wavelength conversion material to partially absorbs the excited light and emits light with a second emission wavelength; and
   a third wavelength conversion material to partially absorbs the excited light and emits light with a third emission wavelength,
   wherein the first emission wavelength has a first emission peak at 530 nm to 540 nm, the second emission wavelength has a second emission peak at 550 nm to 560 nm, the third light-emitting device has a third emission peak at 620 nm to 650 nm,
   wherein all of the first to third wavelength conversion materials are nitride-based fluorescent materials,
   wherein the first emission wavelength has a sub-emission peak at 570 nm to 610 nm.

2. The device of claim 1, wherein a full-width at half maximum (FWHM) of the first emission peak is greater than a full width at half maximum (FWHM) of the second emission peak.

3. The device of claim 2, wherein the full width at half maximum (FWHM) of the first emission peak is in a range of 105 nm to 115 nm, and the full width at half maximum (FWHM) of the second emission peak is in a range of 80 nm to 90 nm.

4. The device of claim 3, wherein the third emission peak has a full width at half maximum (FWHM) of 75 nm to 90 nm.

5. The device of claim 1, wherein the second emission peak is positioned between the first emission peak and the sub-emission peak of the first emission wavelength.

6. The device of claim 1, wherein an intensity ratio between the first emission peak and the sub-emission peak of the first emission wavelength is in a range of 4:2.5 to 4:3.5.

7. The device of claim 1, wherein the first wavelength conversion material has a following chemical formula 1:

$$La_xSi_yN_z:Ce^{3+} \qquad \text{[Chemical formula 1]}$$

where x is from 2.5 to 3.5, y is from 5 to 7, and z is from 9 to 13.

8. The device of claim 1, wherein the second wavelength conversion material has a following chemical formula 2:

$$(Sr_a,Ba_b)_3Si_cO_dN_e:Eu^{2+} \quad \text{[Chemical formula 2]}$$

where each of a and b is from 1 to 4, c is from 1 to 8, and d is from 1 to 8, and e is from 1 to 8.

9. The device of claim 1, wherein the third wavelength conversion material has a following chemical formula 3:

$$(Sr_a,Ca_b)Al_cSi_dN_e:Eu^{2+} \quad \text{[Chemical formula 3]}$$

where each of a and b is from 0.5 to 3, c is from 0.5 to 3, d is from 0.5 to 3, and e is from 1 to 5.

10. The device of claim 1, comprising a wavelength conversion layer comprising a light-transmissive resin and the first to third wavelength conversion materials dispersed in the light-transmissive resin.

11. The device of claim 10, wherein when a sum of contents of the first to third wavelength conversion materials is defined as 100 wt %, the first wavelength conversion material has a content of 30 wt % to 80 wt %, the second wavelength conversion material has a content of 10 wt % to 65.5 wt %, and the third wavelength conversion material has a content of 0.5 wt % to 10%.

12. The device of claim 10, comprising a body having a cavity defined therein for accommodating the light-emitting element and the wavelength conversion layer therein.

13. The device of claim 10, wherein a total content of the first to third wavelength conversion materials is in a range of 5 wt % to 40 wt % of an entire content of the wavelength conversion layer.

14. A light-emitting device comprising:
a light-emitting element configured for emitting excited light;
a first wavelength conversion material to partially absorbs the excited light and emits light with a first emission wavelength;
a second wavelength conversion material to partially absorbs the excited light and emits light with a second emission wavelength; and
a third wavelength conversion material to partially absorbs the excited light and emits light with a third emission wavelength,
wherein the first emission wavelength has a first emission peak at 530 nm to 540 nm, the second emission wavelength has a second emission peak at 550 nm to 560 nm, the third light-emitting device has a third emission peak at 620 nm to 650 nm,
wherein the first emission wavelength has a sub-emission peak at 570 nm to 610 nm.

15. The device of claim 14, wherein the second emission peak is positioned between the first emission peak and the sub-emission peak of the first emission wavelength,
wherein all of the first to third wavelength conversion materials are nitride-based fluorescent materials.

16. The device of claim 15, wherein an intensity ratio between the first emission peak and the sub-emission peak of the first emission wavelength is in a range of 4:2.5 to 4:3.5.

17. The device of claim 1, wherein a full-width at half maximum (FWHM) of the first emission peak is greater than a full width at half maximum (FWHM) of the second emission peak.

18. The device of claim 14, wherein the first wavelength conversion material has a following chemical formula:

$$La_3Si_6N_{11}:Ce^{3+}.$$

19. The device of claim 14, wherein the second wavelength conversion material has a following chemical formula:

$$(Sr,Ba,Mg)Al_cSi_dN_e:Eu^{2+}.$$

20. The device of claim 14, wherein the third wavelength conversion material has a following chemical formula:

$$(Sr_a,Ca_b)Al_cSi_dN_e:Eu^{2+}.$$

* * * * *